US010925198B2

(12) United States Patent
Utsumi

(10) Patent No.: US 10,925,198 B2
(45) Date of Patent: Feb. 16, 2021

(54) SHAFT DEVICE, MOUNTING HEAD, AND SURFACE MOUNTER

(71) Applicant: Yamaha Hatsudoki Kabushiki Kaisha, Iwata (JP)

(72) Inventor: Tomoyoshi Utsumi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 379 days.

(21) Appl. No.: 15/773,531

(22) PCT Filed: Nov. 11, 2015

(86) PCT No.: PCT/JP2015/081764
§ 371 (c)(1),
(2) Date: May 3, 2018

(87) PCT Pub. No.: WO2017/081771
PCT Pub. Date: May 18, 2017

(65) Prior Publication Data
US 2018/0317352 A1 Nov. 1, 2018

(51) Int. Cl.
*H05K 13/04* (2006.01)
*F16C 19/10* (2006.01)
*F16H 25/22* (2006.01)

(52) U.S. Cl.
CPC ....... *H05K 13/0406* (2018.08); *H05K 13/041* (2018.08); *H05K 13/0409* (2018.08);
(Continued)

(58) Field of Classification Search
CPC .......... H05K 13/0406; H05K 13/0409; H05K 13/041; H05K 13/0413; F16C 19/10;
(Continued)

(56) References Cited

U.S. PATENT DOCUMENTS 4,860,438 A * 8/1989 Chen .................. H05K 13/0413
29/740
4,951,383 A * 8/1990 Amao ................ H05K 13/0409
29/721
(Continued)

FOREIGN PATENT DOCUMENTS

CN 201483099 U 5/2010
JP 2005-519783 A 7/2005
(Continued)

OTHER PUBLICATIONS

An Office Action mailed by the State Intellectual Property Office of the People's Republic of China dated Mar. 19, 2020, which corresponds to Chinese Patent Application No. 201580084488.3 and is related to U.S. Appl. No. 15/773,531; with English language translation.
(Continued)

*Primary Examiner* — Peter Dungba Vo
*Assistant Examiner* — Phuong Thai
(74) *Attorney, Agent, or Firm* — Studebaker & Brackett PC

(57) ABSTRACT

A shaft device includes a nut support including a shaft hole, a spline shaft extending through the shaft hole of the nut support, a spline nut having a tubular shape, a bearing of thrust type rotatably supporting the spline nut relative to the nut support, and a biasing member configured to bias the bearing in an axial direction of the spline shaft. The spline nut is disposed coaxially with a portion of the spline shaft protruding upward from the shaft hole and connected to the spline shaft through a spline mechanism.

4 Claims, 17 Drawing Sheets

(52) U.S. Cl.
CPC .......... *H05K 13/0413* (2013.01); *F16C 19/10* (2013.01); *F16H 25/2204* (2013.01)

(58) Field of Classification Search
CPC .......... F16C 19/12; F16C 19/30; F16C 19/32; F16C 19/157; F16H 25/2204
See application file for complete search history.

(56) References Cited

U.S. PATENT DOCUMENTS

| | | | | |
|---|---|---|---|---|
| 5,657,533 | A | * | 8/1997 | Fukui ................. H05K 13/0413 29/740 |
| 2006/0005379 | A1 | * | 1/2006 | Okuda ................. H05K 13/041 29/743 |
| 2009/0056114 | A1 | * | 3/2009 | Kanai ................. H05K 13/041 29/740 |

FOREIGN PATENT DOCUMENTS

| | | |
|---|---|---|
| JP | 4041778 B2 | 1/2008 |
| JP | 2012-80064 A | 4/2012 |
| JP | 2013-071202 A | 4/2013 |
| JP | 2013-135150 A | 7/2013 |
| WO | 2003/092960 A1 | 11/2003 |

OTHER PUBLICATIONS

An Office Action mailed by the German Patent Office dated Jun. 15, 2020, which corresponds to German Patent Application No. 11 2015 007 115.6 and is related to U.S. Appl. No. 15/773,531; with English language translation.
International Search Report issued in PCT/JP2015/081764; dated Feb. 9, 2016.

\* cited by examiner

SHAFT DEVICE, MOUNTING HEAD, AND SURFACE MOUNTER

CROSS-REFERENCE TO RELATED APPLICATION

This application is a National Stage of International Patent Application No. PCT/JP2015/081764, filed Nov. 11, 2015, the entire content of which is incorporated herein by reference.

BACKGROUND

Technical Field

The technology disclosed herein relates to a structure for supporting a spline nut.

Background Art

In a known technique, spline coupling is used to move a shaft in a straight line in the axial direction and to rotate the shaft about the axis. Such a technique is used in a mounting head of a surface mounter that is configured to mount an electronic component on a printed circuit board, for example. More specifically described, the technique is employed in a shaft configured to move up/down and turn pickup nozzles.

A spline nut connected to a spline shaft through a spline mechanism is preferably supported by a bearing for smooth rotation. In a component mounting head disclosed in Japanese Patent No. 4041778, a collar disposed around the outer surface of a spline nut is supported by a radial bearing.

SUMMARY

To downsize a shaft device, which includes a spline nut, a spline shaft, and a bearing, in a radial direction, the outer diameter of the bearing may be reduced, which requires an improvement in the bearing structure.

The technology disclosed herein is made to downsize the shaft device in a radial direction.

A shaft device disclosed herein includes a nut support including a shaft hole, a spline shaft extending through the shaft hole of the nut support, a spline nut having a tubular shape, a bearing of thrust type rotatably supporting the spline nut relative to the nut support, and a biasing member configured to bias the bearing in an axial direction of the spline shaft. The spline nut is disposed coaxially with a portion of the spline shaft protruding upward from the shaft hole and connected to the spline shaft through a spline mechanism. The "thrust type" means that a load is applied to the bearing in an "axial direction".

In this configuration, since the bearing is a thrust type bearing, the bearing is able to have a smaller outer diameter than a radial bearing. This enables the overall size of the shaft device including the bearing to be reduced in the radial direction.

The following configurations are preferable aspects of the shaft device disclosed herein.

The nut support may include a housing portion housing an end portion of the spline nut. The bearing may rotatably support the spline nut in the housing portion. With this configuration, the spline nut is supported in the housing portion.

The bearing may include a shaft-side track plate in contact with an end of the spline nut, a housing-side track plate composed of a bottom wall of the housing portion, and a rolling element disposed between the shaft-side track plate and the housing-side track plate. In this configuration, since the housing-side track plate is composed of the bottom wall of the housing portion, the number of components is reduced.

A mounting head disclosed herein includes the above-described shaft device, a component retainer disposed at an end of the spline shaft and configured to hold an electronic component, a base supporting the shaft device, an axial drive unit configured to move the spline shaft in the axial direction, and a rotary drive unit configured to transmit torque to the spline nut to rotate the spline shaft about its axis. The mounting head having this configuration is able to have a smaller size. Furthermore, the mounting head may include a plurality of shaft devices. In such a case, the spline shafts are able to be arranged at a small pitch, enabling the mounting head to include more spline shafts.

The following configuration is a preferable aspect of the mounting head disclosed herein. The mounting head may further include a return spring disposed between the spline shaft and the spline nut in a compressed state. The return spring is configured to return the spline shaft moved downward by the axial drive unit to an upward movement end. The return spring is configured to function as the biasing member that biases the bearing in the axial direction via the spline nut. This configuration does not require a separate biasing member, reducing the number of components of the mounting head.

The technology disclosed herein reduces the overall size of the shaft device including the bearing in the radial direction.

DETAILED DESCRIPTION (Overall Configuration of Surface Mounter)

Figure 1:
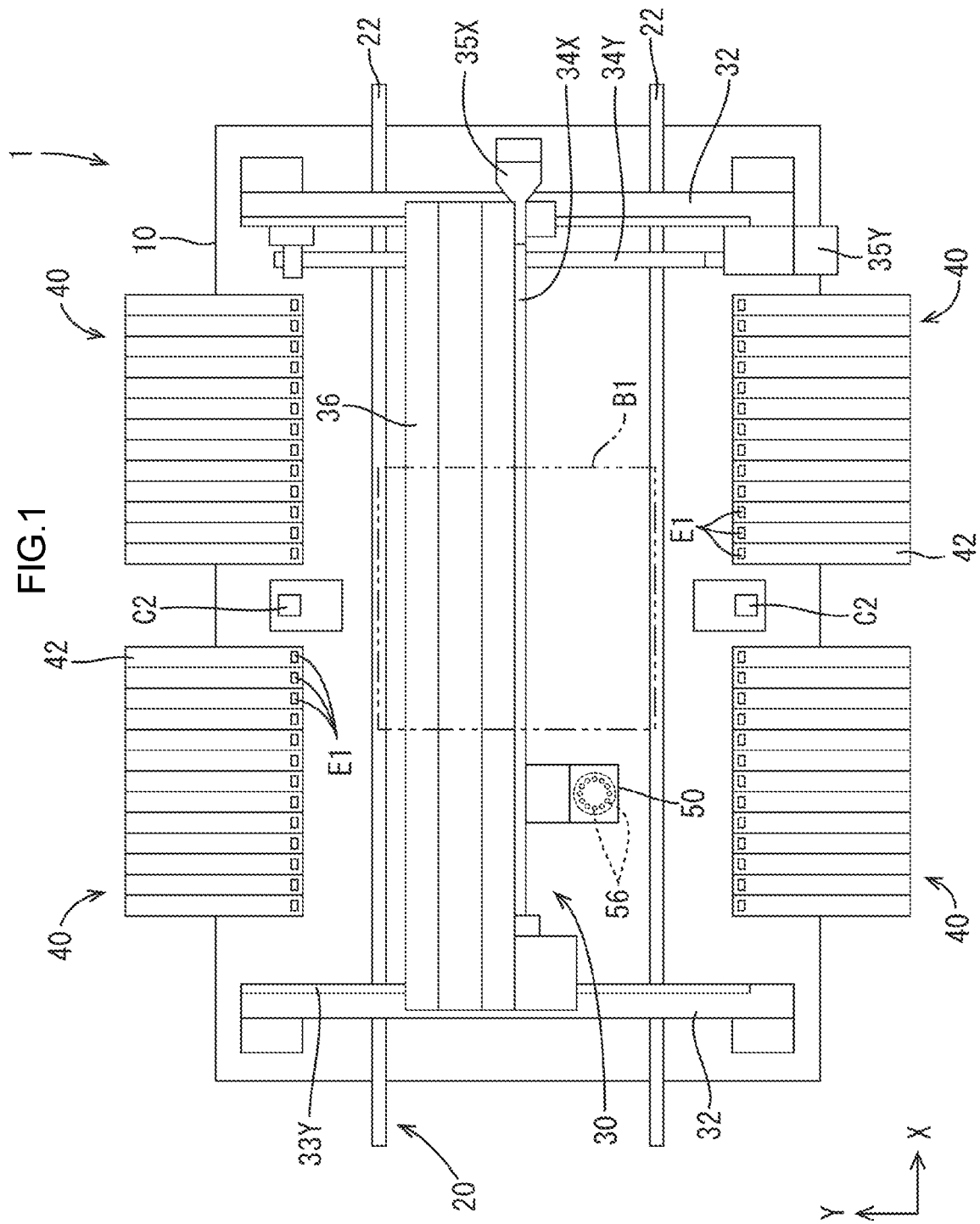
FIG. 1 is a plan view of a surface mounter adapted as an embodiment.

An embodiment is described with reference to the drawings. In this embodiment, a surface mounter 1 illustrated in FIG. 1 is described as an example. The surface mounter 1 includes a base board 10, a transfer conveyor 20 configured to transfer a printed circuit board (one example of a board) B1, a component mounting device 30 configured to mount an electronic component (one example of a component) E1 on the printed circuit board B1, and component feeding portions 40, for example.

The base board 10 has an oblong shape in plan view and has a flat upper surface. A backup device for supporting the printed circuit board B1 during mounting of the electronic component E1 on the printed circuit board B1 is provided below the transfer conveyor 20 on the base board 10. In the following description, the longitudinal direction of the base board 10 (the left-right direction in FIG. 1) and the transfer direction of the transfer conveyor 20 are referred to as an X direction. The width direction of the base board 10 (the up-down direction in FIG. 1) is referred to as a Y direction. The up-down direction of the base board 10 (the up-down direction in FIG. 2) is referred to as a Z direction.

The transfer conveyor 20 is located at the substantially middle of the base board 10 in the Y direction and is configured to transfer the printed circuit board B1 in the transfer direction (the X direction). The transfer conveyor 20 includes a pair of conveyor belts 22 configured to circulate in the transfer direction. The printed circuit board B1 is positioned across the conveyor belts 22. The printed circuit board B1 is transferred from one side in the transfer direction (the right side in FIG. 1) along the conveyor belt 22 to an operation position (an area surrounded by a two-dot chain line in FIG. 1) on the base board 10 where the printed circuit board B1 is stopped for the mounting operation of the electronic component E1. Then, the printed circuit board B1 is transferred to the other side (the left side in FIG. 1) along the conveyor belt 22 and discharged.

Two component feeding portions 40 are arranged side by side in the X direction on each side of the transfer conveyor 20 (each side in the up-down direction in FIG. 1), i.e., the total of four component feeding portions 40. The component feeding portions 40 each include a plurality of feeders 42. The feeders 42, which are component feeding devices, are arranged side by side. The feeders 42 each include a reel (not illustrated), around which a component feeding tape (not illustrated) holding the electronic components E1 is wound, and an electrical unwinding device (not illustrated), which is configured to unwind the component feeding tape from the reel, for example. The feeder 42 supplies the electronic components E1 one by one from component feeding positions located at the end adjacent to the transfer conveyor.

The component mounting device 30 includes a pair of supporting frames 32, a rotary type mounting head 50, and a mounting head drive mechanism configured to drive the mounting head 50. The supporting frames 32 extending in the Y direction are positioned at the both sides of the base board 10 in the X direction.

A Y-axis servomechanism includes Y-axis guide rails 33Y, a Y-axis ball screw 34Y on which a ball nut (not illustrated) is threadably mounted, and a Y-axis servomotor 35Y. A head support 36 fixed to the ball nut is attached to each Y-axis guide rail 33Y. The ball nut is moved forward or backward along the Y-axis ball screw 34Y when the Y-axis servomotor 35Y is energized. This moves the head support 36 fixed to the ball nut and the mounting head 50, which will be described later, in the Y direction along the Y-axis guide rails 33Y.

An X-axis servomechanism includes an X-axis guide rail (not illustrated), an X-axis ball screw 34X on which a ball nut (not illustrated) is threadably mounted, and an X-axis servomotor 35X. The mounting head 50 is attached to the X-axis guide rail in a movable manner in the axial direction of the X-axis guide rail. The ball nut is moved forward or backward along the X-axis ball screw 34X when the X-axis servomotor 35X is energized. This moves the mounting head 50 fixed to the ball nut in the X direction along the X-axis guide rail.

As described above, the mounting head 50 is movable in the X direction and the Y direction in a predetermined range of movement by the X-axis servomechanism and the Y-axis servomechanism.

(Structure of Mounting Head)

Figure 2:
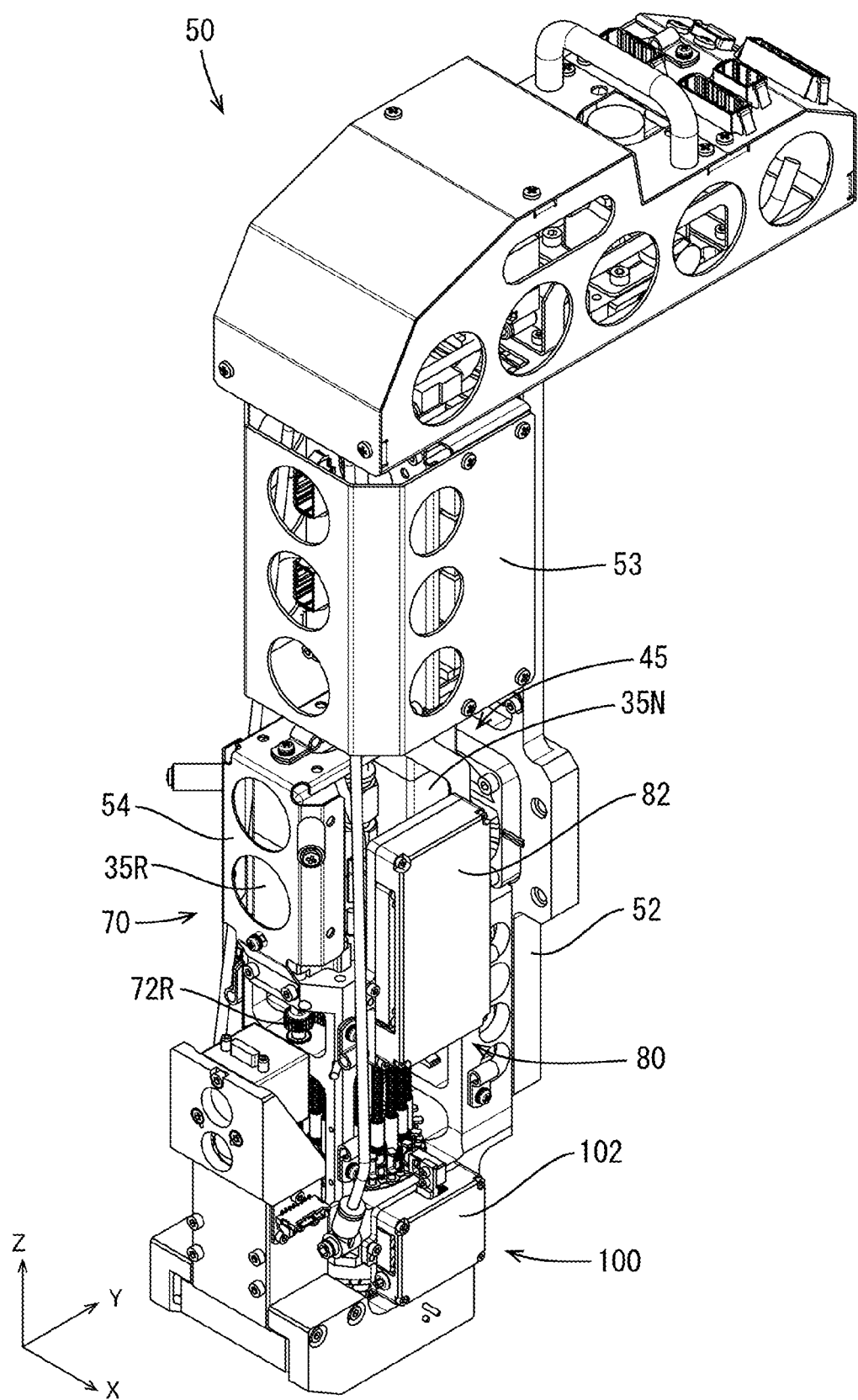
FIG. 2 is a perspective view of a mounting head.
Figure 3:
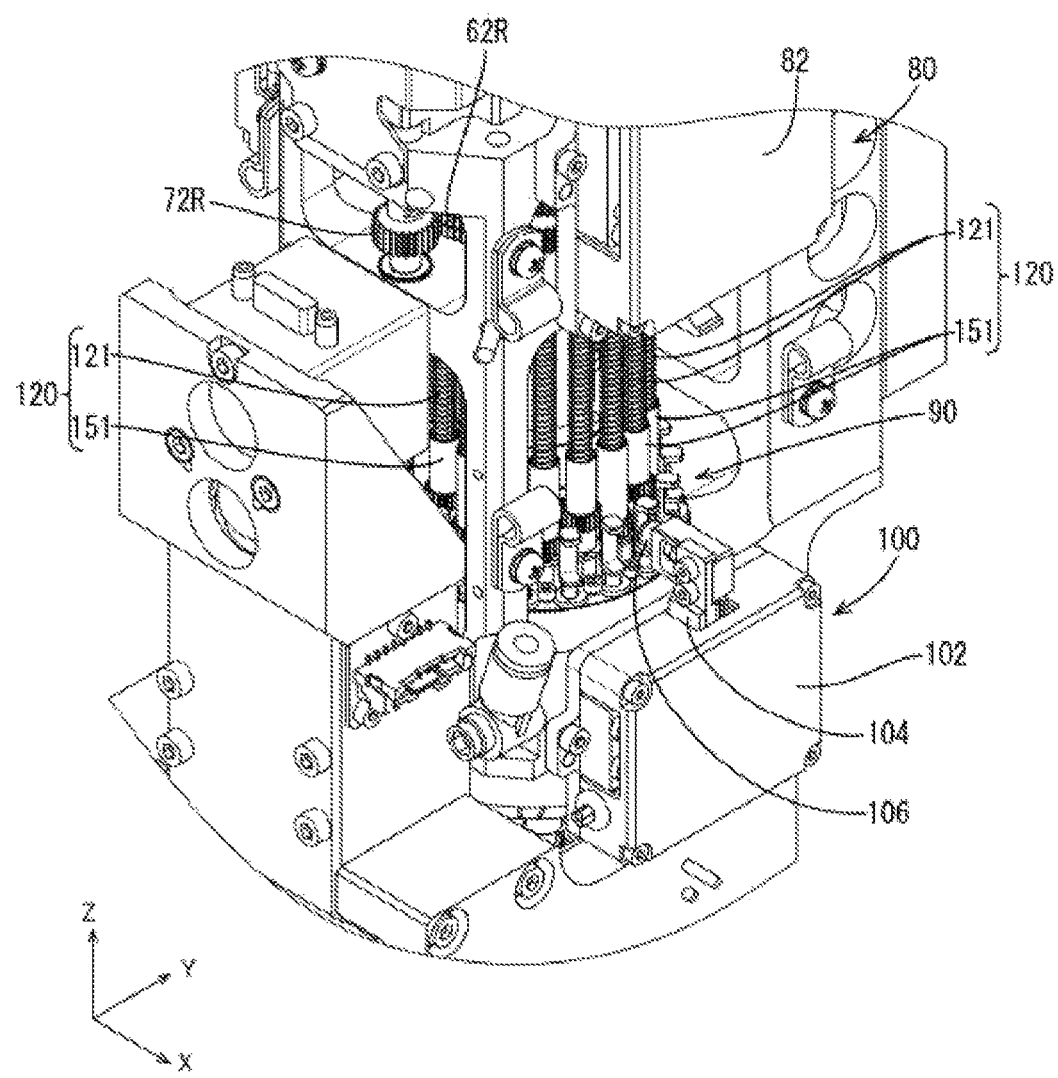
FIG. 3 is a magnified perspective view of a portion of the mounting head.
Figure 4:
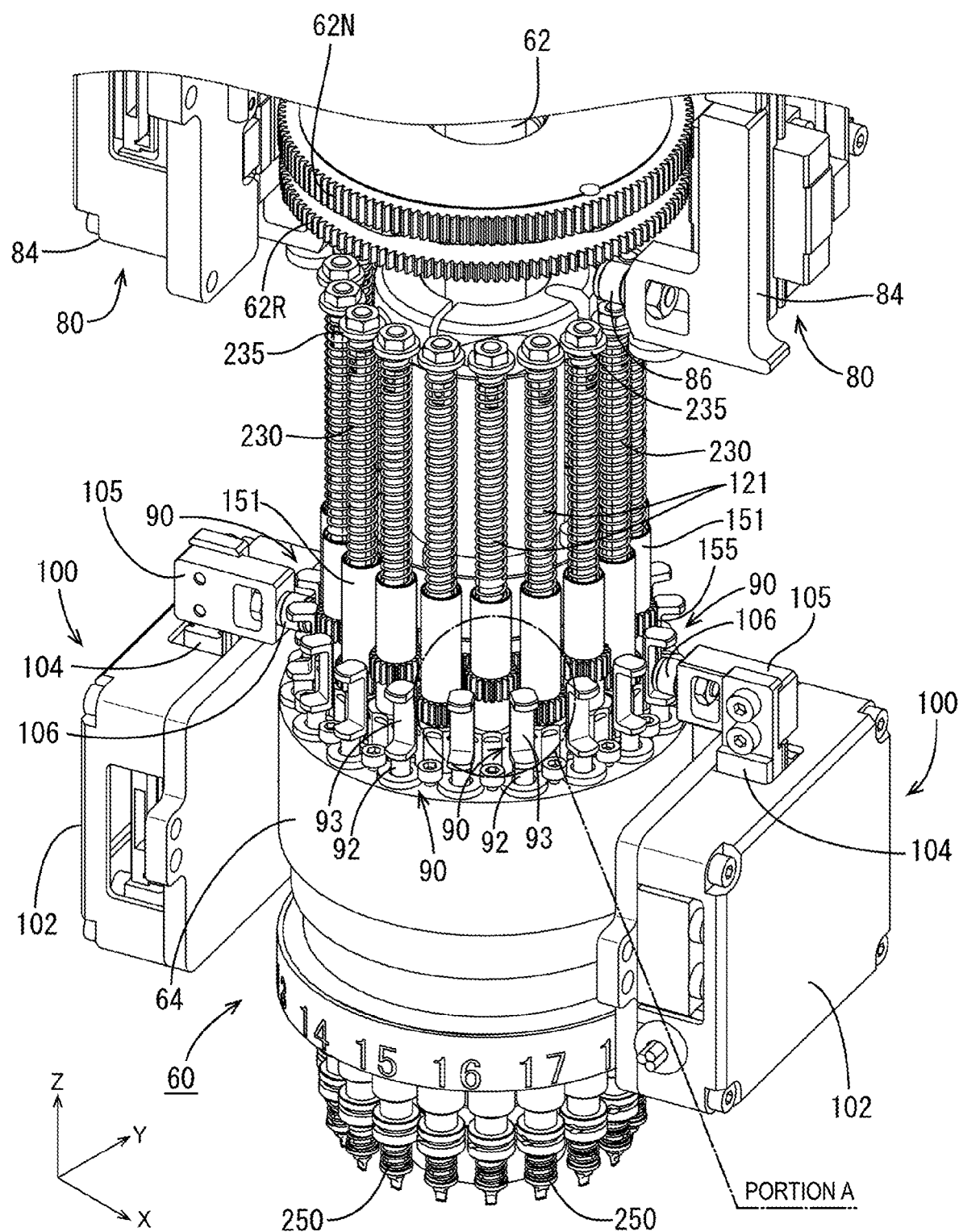
FIG. 4 is a perspective view illustrating a structure of a rotary body.

Next, the structure of the mounting head 50 is described in detail. The mounting head 50 is configured to hold the electronic component E1 fed by the feeder 42 by suction and mount the electronic component E1 on the printed circuit board B1. As illustrated in FIG. 2 to FIG. 4, the mounting head 50 of this embodiment includes a head body 60, a head supporting member 52 supporting the head body 60, and covers 53 and 54.

Figure 6:
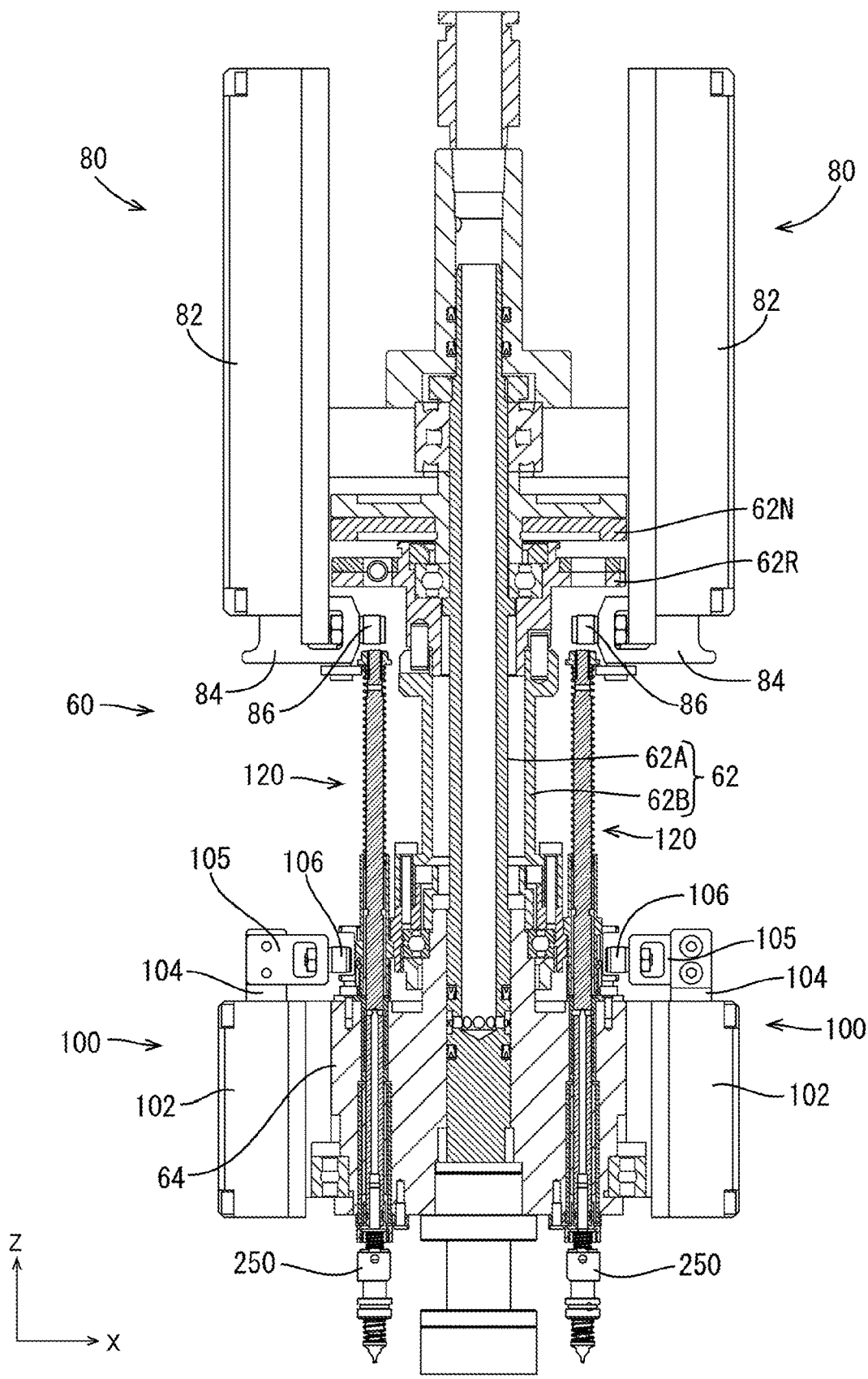
FIG. 6 is a cross-sectional view of main components of the mounting head.

As illustrated in FIG. 4 and FIG. 6, the head body 60, which is a rotary type head body, includes a shaft 62 having a cylindrical shape extending in the Z direction, a rotary body (corresponding to a "base" of this disclosure) 64, eighteen shaft devices 120, and an N-axis drive unit 45.

The shaft 62 has a two-layered structure and includes an outer shaft 62B and an inner shaft 62A located inwardly from the outer shaft 62B. The inner shaft 62A is supported by the head supporting member 52 in a rotatable manner about the axis of the shaft 62A.

The rotary body 64 has a substantially cylindrical shape and has a larger diameter than the shaft 62. The rotary body 64 is fixed to the lower portion of the inner shaft 62A. The rotary body 64 has eighteen through holes 65. The eighteen through holes 65 are arranged in the circumferential direction with an equal distance therebetween. The shaft devices 120 are attached to the respective through holes 65.

At an upper portion of the shaft 62, an N-axis driven gear 62N and an R-axis driven gear 62R are arranged one above the other (see FIG. 4). The N-axis driven gear 62N and the R-axis driven gear 62R are respectively engaged with the inner shaft 62A and the outer shaft 62B.

The N-axis drive unit 45 includes an N-axis servomotor 35N and an N-axis driving gear (not illustrated) disposed around the output shaft of the N-axis servomotor 35N. The N-axis driving gear and the N-axis driven gear 62N are engaged together. When the N-axis servomotor 35N is energized, the power of the motor 35N is transmitted to the inner shaft 62A through the N-axis driving gear and the N-axis driven gear 62N. This rotates the rotary body 64 together with the inner shaft 62A, and thus the eighteen shaft devices 120 supported by the rotary body 64 are rotated together with the rotary body 64.

The outer shaft 62B is supported by the inner shaft 62A and the rotary body 64 at the axial end portions thereof via bearings. The outer shaft 62B is rotatable relative to the inner shaft 62A and the rotary body 64.

(Shaft Device)

Figure 8:
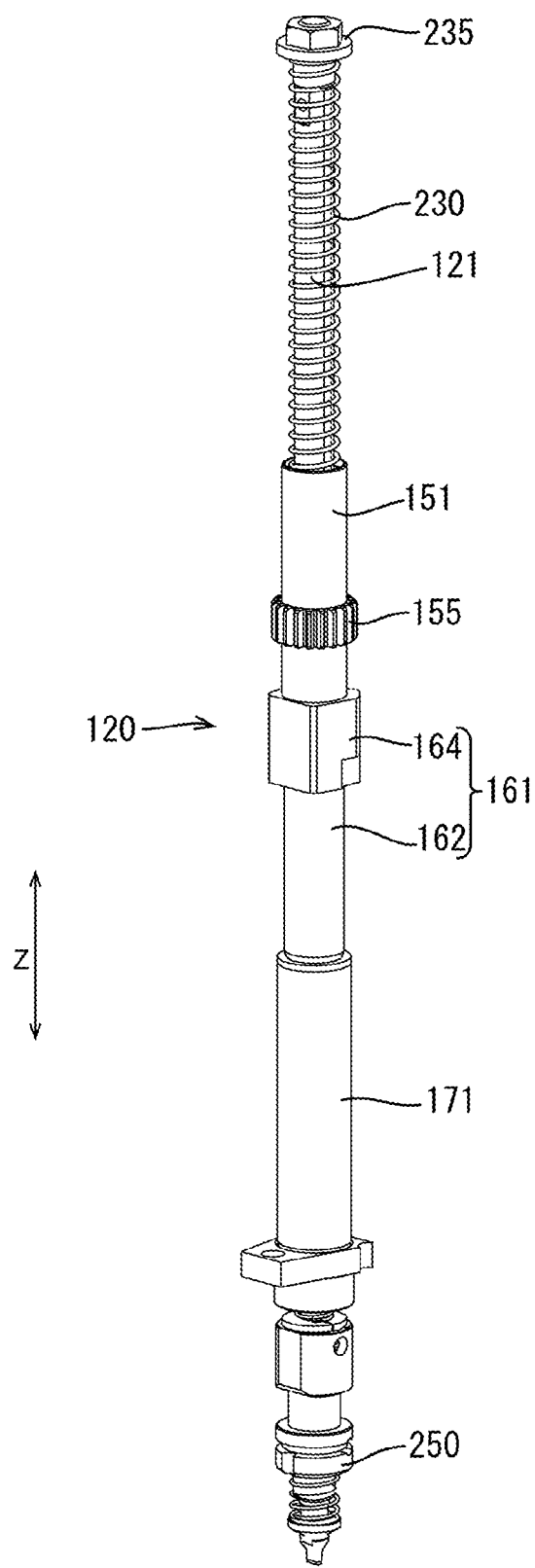
FIG. 8 is a perspective view of a shaft device.
Figure 9:
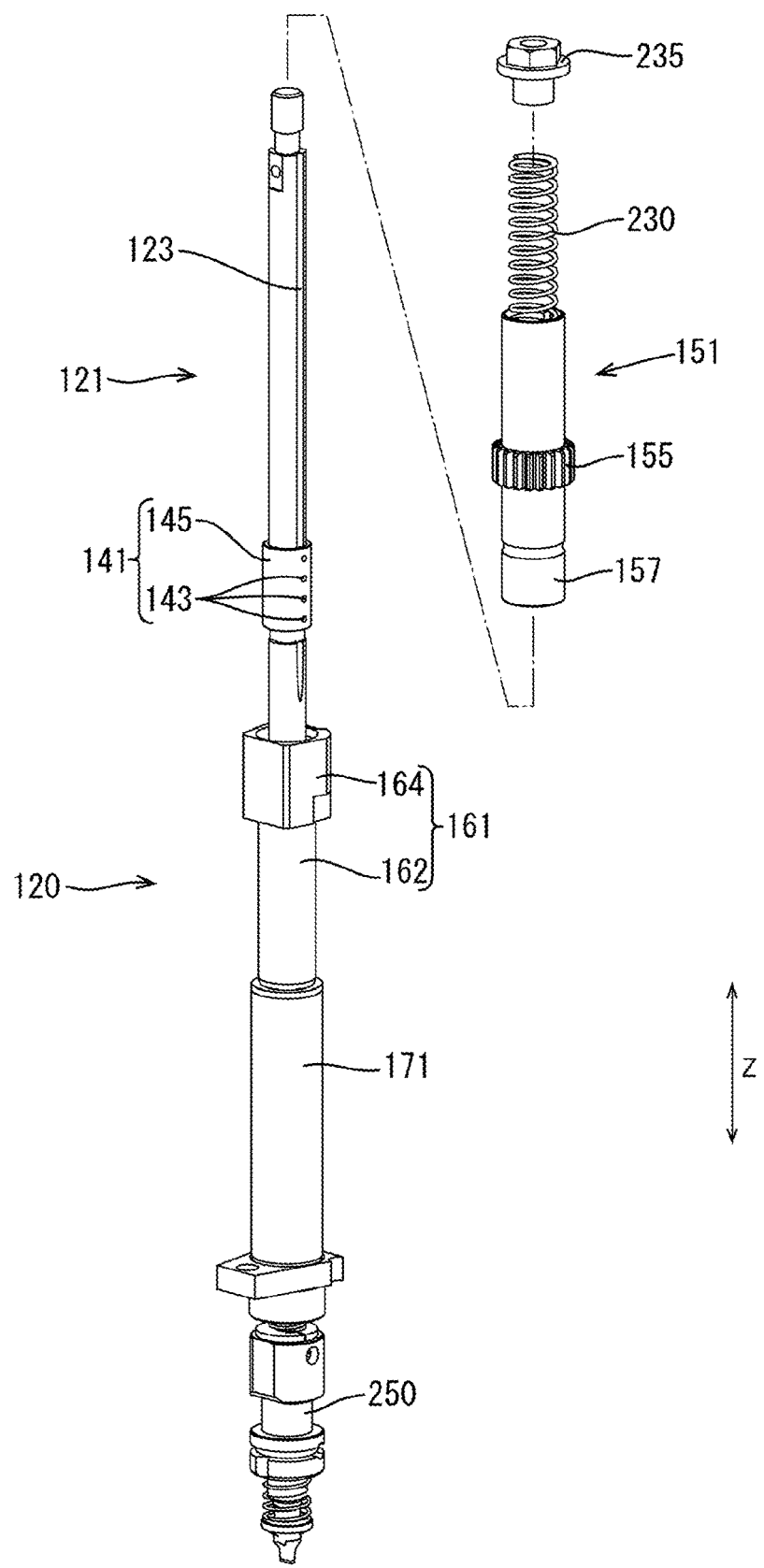
FIG. 9 is an exploded perspective view of the shaft device.
Figure 10:
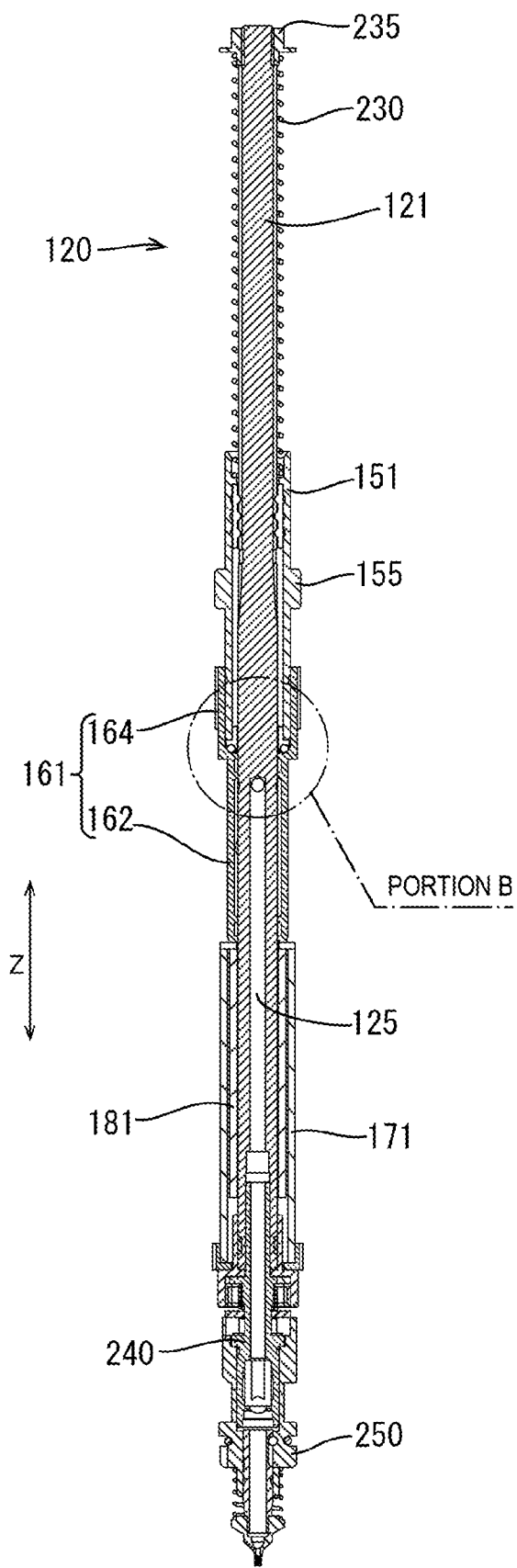
FIG. 10 is a cross-sectional view of the shaft device.
Figure 13:
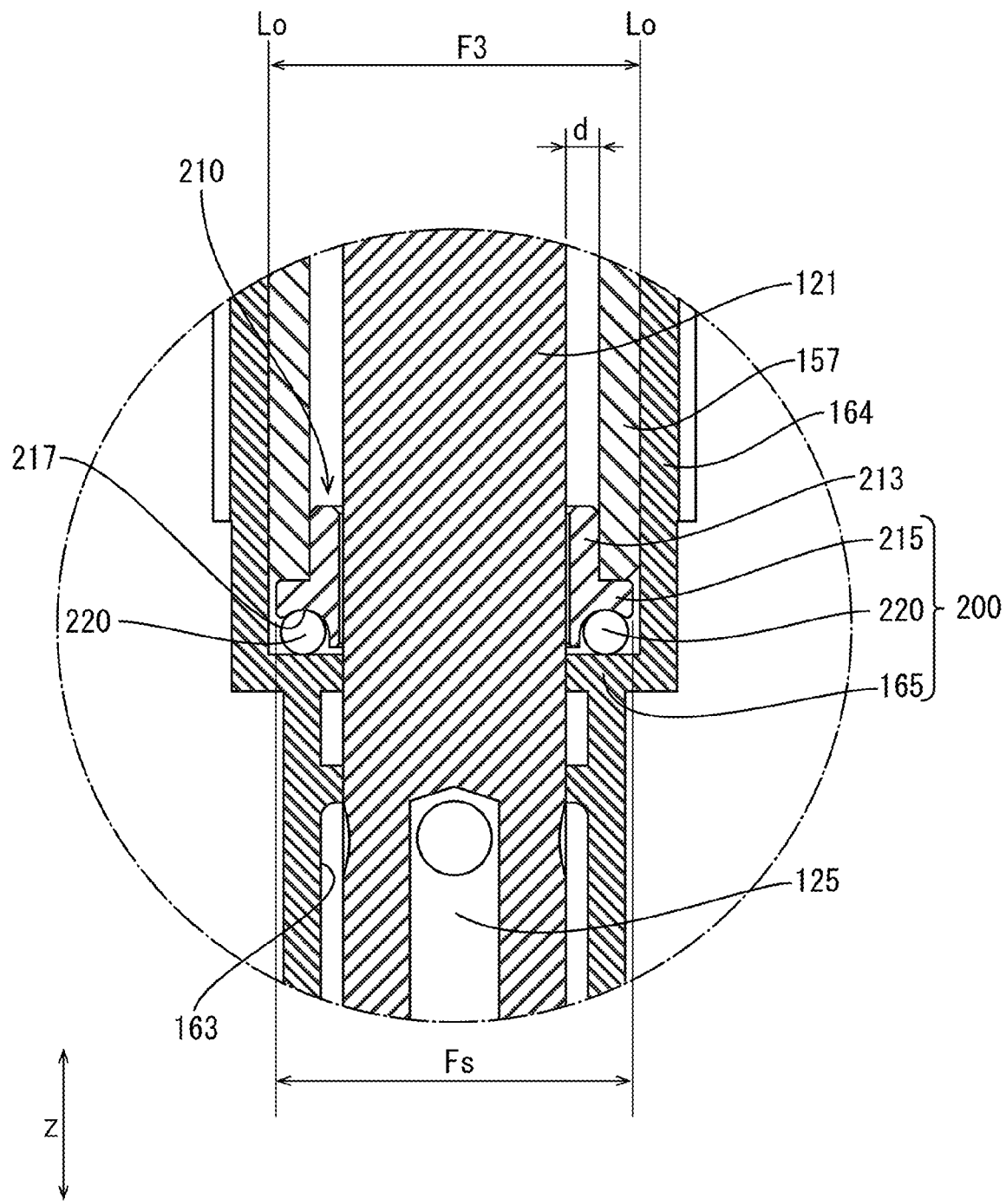
FIG. 13 is a magnified view of a portion B in FIG. 10.

As illustrated in FIG. 8 to FIG. 10, the shaft device 120 includes a spline shaft 121, a ball retainer 141, a spline nut 151, a first shaft tube (corresponding to a "nut support" of the disclosure) 161, a second shaft tube 171, a ball cage 181, a coil spring (corresponding to a "return spring" of the disclosure) 230, and a bearing 200 (see FIG. 13). The first shaft tube 161 has a tubular shape having a through hole extending in the Z direction (the up-down direction). The first shaft tube 161, which has a stepped configuration, includes a shaft body 162 having a small diameter and a housing portion 164 having a large diameter.

Figure 7:
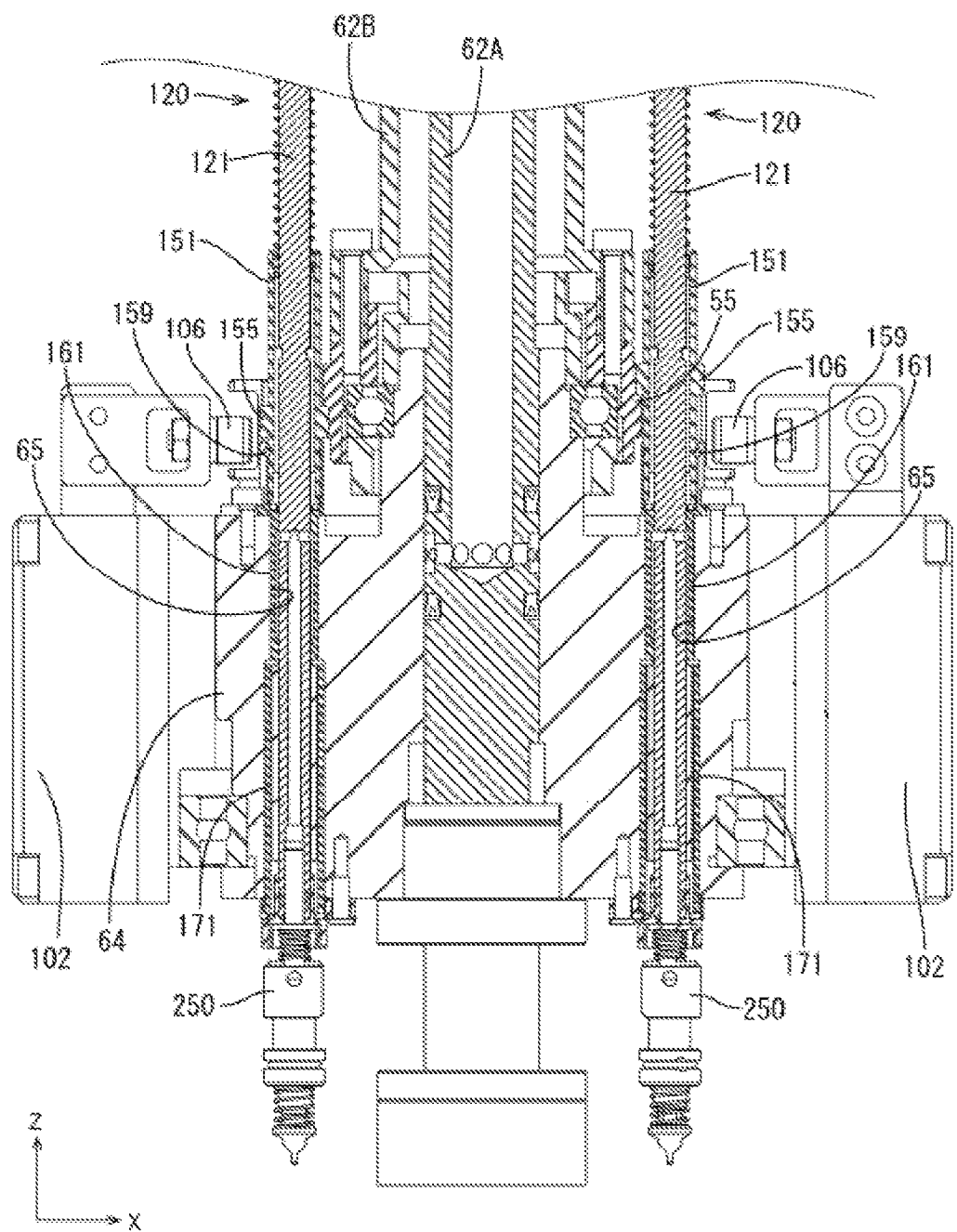
FIG. 7 is a magnified view of a portion (a lower half) in FIG. 6.

As illustrated in FIG. 7, the shaft body 162 of the first shaft tube 161 is located at the upper portion of the through hole 65 in the rotary body 64. The first shaft tube 161 is fixed to the through hole 65 in a non-rotatable manner. The housing portion 164 of the first shaft tube 161 is not located in the through hole 65 and is positioned above the upper surface of the rotary body 64.

As illustrated in FIG. 7, the second shaft tube 171 is located at the lower portion of the through hole 65 in the rotary body 64 and fixed to the through hole 65 in a non-rotatable manner. The end portion (the lower end portion) of the second shaft tube 171 protrudes from the lower surface of the rotary body 64.

As illustrated in FIG. 8 and FIG. 9, the spline shaft 121 is long in the Z direction (the up-down direction). The spline shaft 121 has a ball groove 123 on the outer surface thereof. The ball groove 123 is long in the Z-direction (the up-down direction).

The spline shaft 121 extends through a shaft hole 163 of the first shaft tube 161 and a shaft hole 173 of the second shaft tube 171, which are located one above the other, in this order. The spline shaft 121 is located in the first and second shaft tubes 161 and 171. The lower portion of the spline shaft 121 protrudes downward from the lower surface of the rotary body 64 and the upper portion thereof protrudes upward from the upper surface of the rotary body 64.

The ball cage 181 is located in the second shaft tube 171. The ball cage 181 supports the spline shaft 121 relative to the second shaft tube 171. In other words, the ball cage 181 supports the spline shaft 121 such that the spline shaft 121 is movable linearly in the axial direction and rotatable about the axis.

As illustrated in FIG. 8 and FIG. 9, the spline nut 151 has a tubular shape having a through hole extending in the Z direction and has a ball groove (not illustrated) extending in the up-down direction in the inner surface. A gear 155 is disposed on the outer surface of the spline nut 151.

The spline nut 151 is located coaxially with a portion of the spline shaft 121 protruding upward from the first shaft tube 161. The spline nut 151 has a lower portion 157 fitted in the housing portion 164 of the first shaft tube 161. The spline nut 151 is rotatably supported by the bearing 200 relative to the housing portion 164 of the first shaft tube 161. The spline nut 151 is prevented from coming off the housing portion 164 by a pin 159.

The ball retainer 141 is located between the spline shaft 121 and the spline nut 151. The ball retainer 141 includes a plurality of balls 143 arranged in a predetermined arrangement and a tubular holder 145 rollably holding the balls 143. The balls 143 are aligned in the Z-direction (the up-down direction) on the holder 145. The aligned balls 143 are fitted into both the ball groove 123 of the spline shaft 121 and a ball groove (not illustrated) of the spline nut 151. In FIG. 9, the balls 143 arranged in one line are illustrated, but the balls 143 are also aligned on the rear side, which is not illustrated in FIG. 9, and thus the balls 143 are arranged in two lines in the actual configuration. Thus, the outer surface of the spline shaft 121 and the inner surface of the spline nut 151 each have two ball grooves.

The spline shaft 121 is connected to the spline nut 151 through a ball spline mechanism by the ball retainer 141, and thus rotational torque is transmitted to the spline shaft 121 through the spline nut 151. Furthermore, the spline shaft 121 is able to slide (linearly move) in the Z direction relative to the spline nut 151. As illustrated in FIG. 13, the bearing 200 is a rolling bearing using balls, which are rolling elements, and is configured to rotatably support (bear) the spline nut 151 in the housing portion 164 of the first shaft tube 161.

The bearing 200 is a thrust bearing and is configured to support an axial load applied in the Z direction, which is an axial direction of the spline shaft 121. As illustrated in FIG. 13, the bearing 200 includes a shaft-side track member 210, which includes a shaft-side track plate 215, balls 220, which are rolling elements, and a housing-side track plate 165 of the housing portion 164.

The shaft-side track member 210 includes an inner fitting tube 213 having a through hole extending in the up-down direction and a shaft-side track plate 215. The inner fitting tube 213 is located inwardly from the lower portion 157 of the spline nut 151. The shaft-side track plate 215, which is located on the lower end of the inner fitting tube 213, protrudes outwardly from the lower end of the inner fitting tube 213.

The shaft-side track plate 215 has a ring shape. The end (the lower end) of the lower portion 157 of the spline nut 151 is in contact with the upper surface of the shaft-side track plate 215. The outer diameter of the shaft-side track plate 215 is smaller than the inner diameter of the housing portion 164 such that a space is provided between the shaft-side track plate 215 and the inner surface of the housing portion 164. The lower surface of the shaft-side track plate 215 is a track surface in contact with the balls 220, which are rolling elements.

The housing-side track plate 165 is composed of a bottom surface of the housing portion 164. The upper surface of the housing-side track plate 165 is a track surface in contact with the balls 220, which are rolling elements, and supports the balls 220.

As illustrated in FIG. 13, the shaft-side track plate 215 of the shaft-side track member 210 and the housing-side track plate 165 of the housing portion 164 face each other in the axial direction (the up-down direction) with the balls 220, which are rolling elements, located therebetween. The number of balls 220, which are rolling elements arranged between the shaft-side track plate 215 and the housing-side track plate 165 in the circumferential direction, is two or more.

As illustrated in FIG. 13, the track surface (the lower surface) of the shaft-side track plate 215 has an arc-like track groove 217 extending in the circumferential direction. The track groove 217 is shaped in conformity with the balls 220. The track surface of the housing-side track plate 165 of the housing portion 164 is a horizontal smooth surface extending perpendicular to the Z direction.

In the bearing 200 having the above-described configuration, the balls 220 located between the shaft-side track plate 215 and the housing-side track plate 165 come in contact with the upper and lower track surfaces. This allows the balls 220 to roll in the circumferential direction along the track groove 217 while an axial (vertical) load being applied thereto. This reduces friction during rotation of the spline nut 151, resulting in smooth rotation of the spline nut 151.

Figure 14:
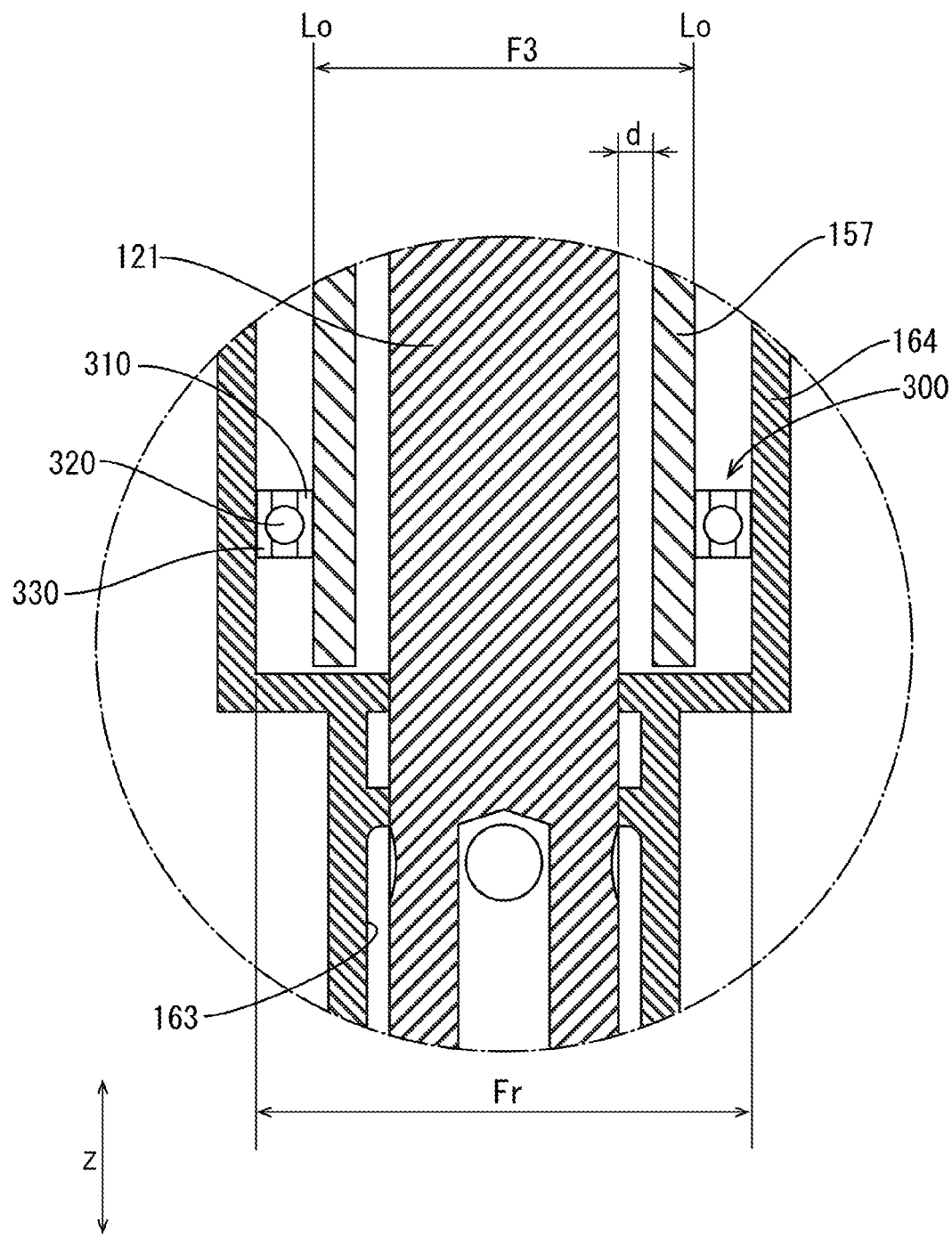
FIG. 14 is a magnified view of a portion B in FIG. 10 (indicating a comparative example)

Furthermore, since the bearing 200 is a thrust bearing, the outer diameter of the bearing 200 is smaller than that of a bearing 300, which is a radial bearing. More specifically described, as illustrated in FIG. 14, the radial bearing 300 includes an inner ring 310, balls 320, and an outer ring 330. Contrary to this, a thrust bearing does not include an outer ring 330 on the outer side of the balls 220. Thus, the outer diameter Fs of the bearing 200 is smaller than that of the radial bearing by an amount corresponding to the outer ring 330 (Fs<Fr).

In addition, as illustrated in FIG. 14, since the radial bearing 300 receives a radial load, the balls 320 are located radially outwardly from the lower portion 157 of the ball spline nut 151. Contrary to this, the thrust bearing 200 may have any configuration that receives the axial (the Z direction) load, and the balls 220 does not always have to be located between the outer surface of the lower portion 157 of the ball spline nut 151 and the inner surface of the housing portion 164. In this example, the balls 220 of the bearing 200 are located below the lower portion 157 of the spline nut 151. As illustrated in FIG. 13, the balls 220 are located radially inwardly from an outline Lo of the spline nut 151. In other words, the balls 220 are located in an area F3 illustrated in FIG. 13.

As described above, in the thrust bearing 200, the balls 220 are able to be located closer to the center in the radial direction than the radial bearing 300. Thus, the outer diameter Fs of the thrust bearing 200 is smaller than that of the radial bearing (Fs<Fr).

In particular, in this example, the entire bearing 200 is located inwardly from the outline Lo of the ball spline nut 151. Thus, the outer diameter Fs of the bearing 200 is further reduced.

As described above, since the bearing 200 is a thrust bearing, the diameter Fs thereof is small compared to that of a radial bearing. Thus, the size of the shaft device 120 is reduced in the radial direction.

As illustrated in FIG. 13 and FIG. 14, a gap d is provided between the inner surface of the lower portion 157 of the spline nut 151 and the outer surface of the spline shaft 121. This gap is provided for the above-described ball retainer 141.

Figure 12:
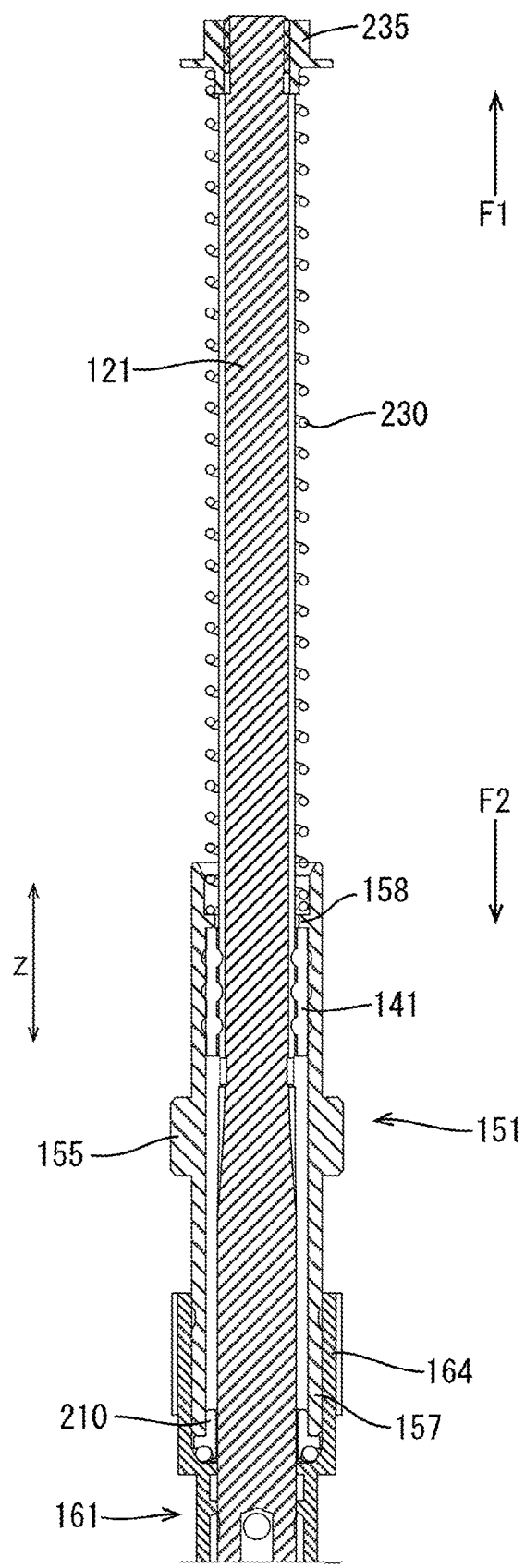
FIG. 12 is a cross-sectional view of an upper half of the shaft device (a magnified view of an upper half in FIG. 10)

Next, a coil spring 230 for biasing the bearing 200 in the Z direction, which is the axial direction of the spline shaft 121 (more specifically described, in the downward direction in which the spline nut 151 approaches to the housing portion 164 in FIG. 12), is described.

As illustrated in FIG. 8 and FIG. 9, the coil spring 230 is attached to the upper portion of the spline shaft 121. As illustrated in FIG. 12, the coil spring 230 is disposed between a spring retaining nut 235 attached to the upper end of the spline shaft 121 and a circular spring retaining plate 158 disposed on the inner surface of the upper portion of the spline nut 151.

The distance between the spring retaining plate 158 and the spring retaining nut 235 in the Z direction is largest when the spline shaft 121 is moved to the upward movement end in FIG. 6. The coil spring 230 in such a state is still compressed and biases the spline shaft 121 in the upward direction (indicated by an arrow F1 in FIG. 12) all the time. The counteracting force of the force that biases the spline shaft 121 in the upward direction is applied to the spline nut 151 in the downward direction, and the force is applied to the bearing 200 through the spline nut 151 (indicated by an arrow F2 in FIG. 12). With this configuration, the load is applied to the bearing 200 in the Z direction, which is the axial direction.

Figure 11:
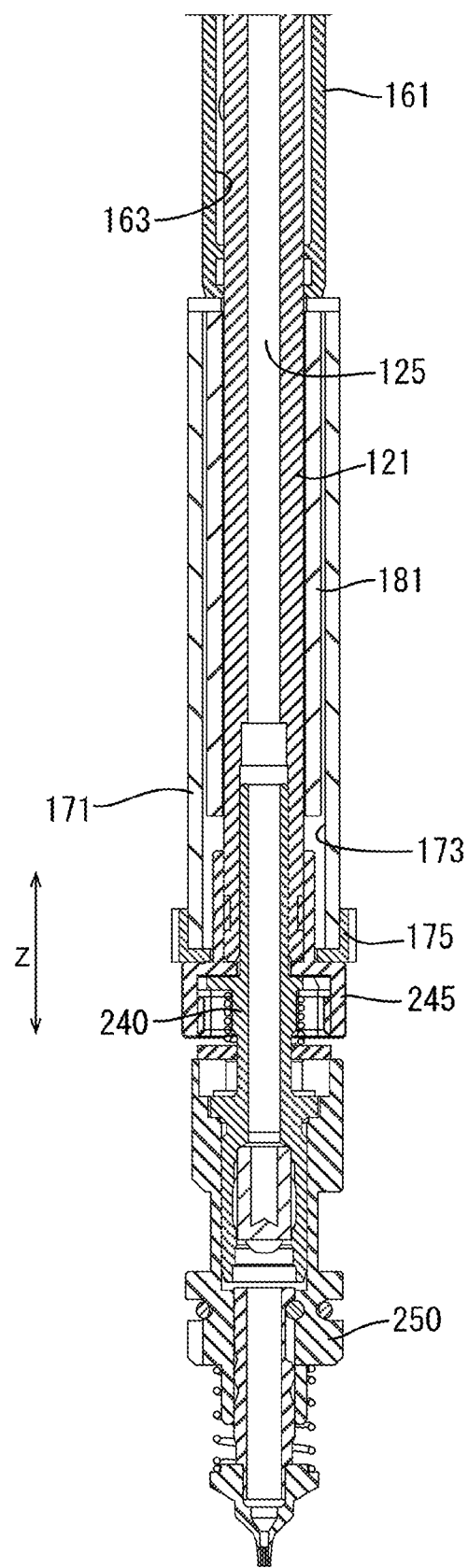
FIG. 11 is a cross-sectional view of a lower half of the shaft device (a magnified view of a lower half in FIG. 10)

Furthermore, as illustrated in FIG. 7 and FIG. 11, a pickup nozzle (corresponding to a "component retainer" of the disclosure) 250 configured to hold an electronic component E1 by suction is provided at a lower portion of each spline shaft 121 protruding downwardly from the rotary body 64 through a nozzle holder 240. As illustrated in FIG. 11, the spline shafts 121 each have a supply passage 125 extending in the axial direction at the middle portion. A negative pressure or a positive pressure is applied to the pickup nozzle 250 through the supply passage 125. The pickup nozzles 250 are each configured to hold an electronic component E1 by suction at the end portion by means of a negative pressure and to release the electronic component E1, which is held at the end portion, by means of a positive pressure.

Figure 15:
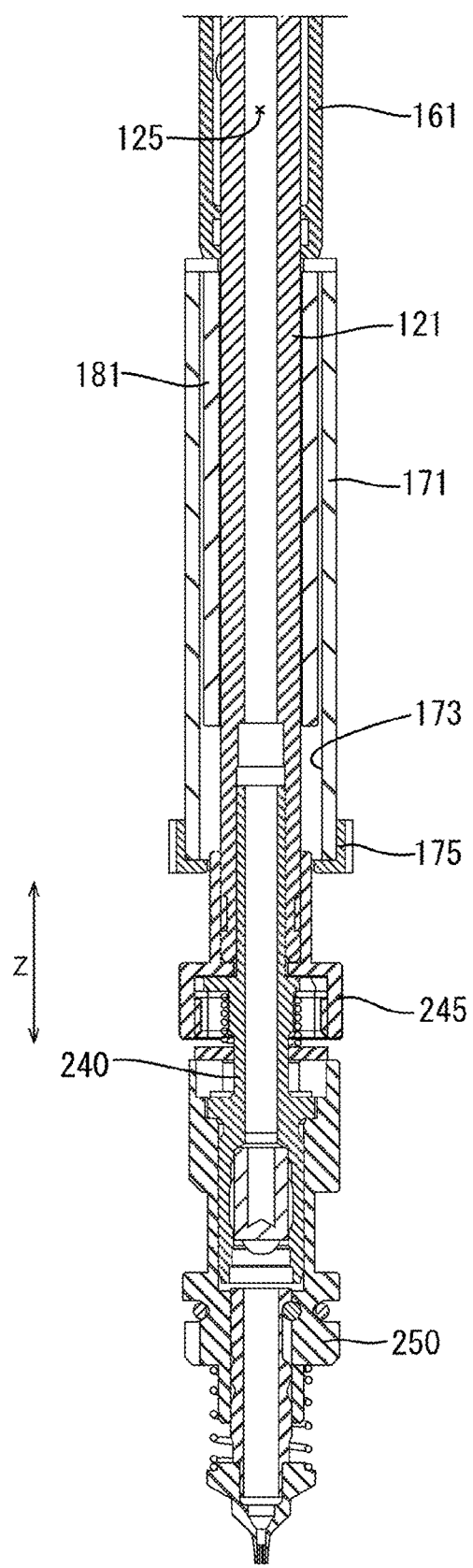
FIG. 15 is a cross-sectional view of a lower half of the shaft device (indicating a state in which a shaft is moved down from the state in FIG. 11)

A stopper 245 is located outwardly from the nozzle holder 240. When the spline shaft 121 is moved to the upward movement end illustrated in FIG. 6, the stopper 245 comes in contact with a cover 175, which is attached to the lower end of the second shaft tube 171, as illustrated in FIG. 11. This regulates the position of the spline shaft 121. FIG. 15 illustrates a state in which the pickup nozzle has been moved down.

(R-Axis Drive Unit and Z-Axis Drive Unit)

As illustrated in FIG. 2, the mounting head 50 includes an R-axis drive unit 70 and two Z-axis drive units 80. The R-axis drive unit (corresponding to a "rotary drive unit" of the disclosure) 70 is configured to rotate the spline shafts 121 about the respective axes in the same direction at the same time.

Figure 5:
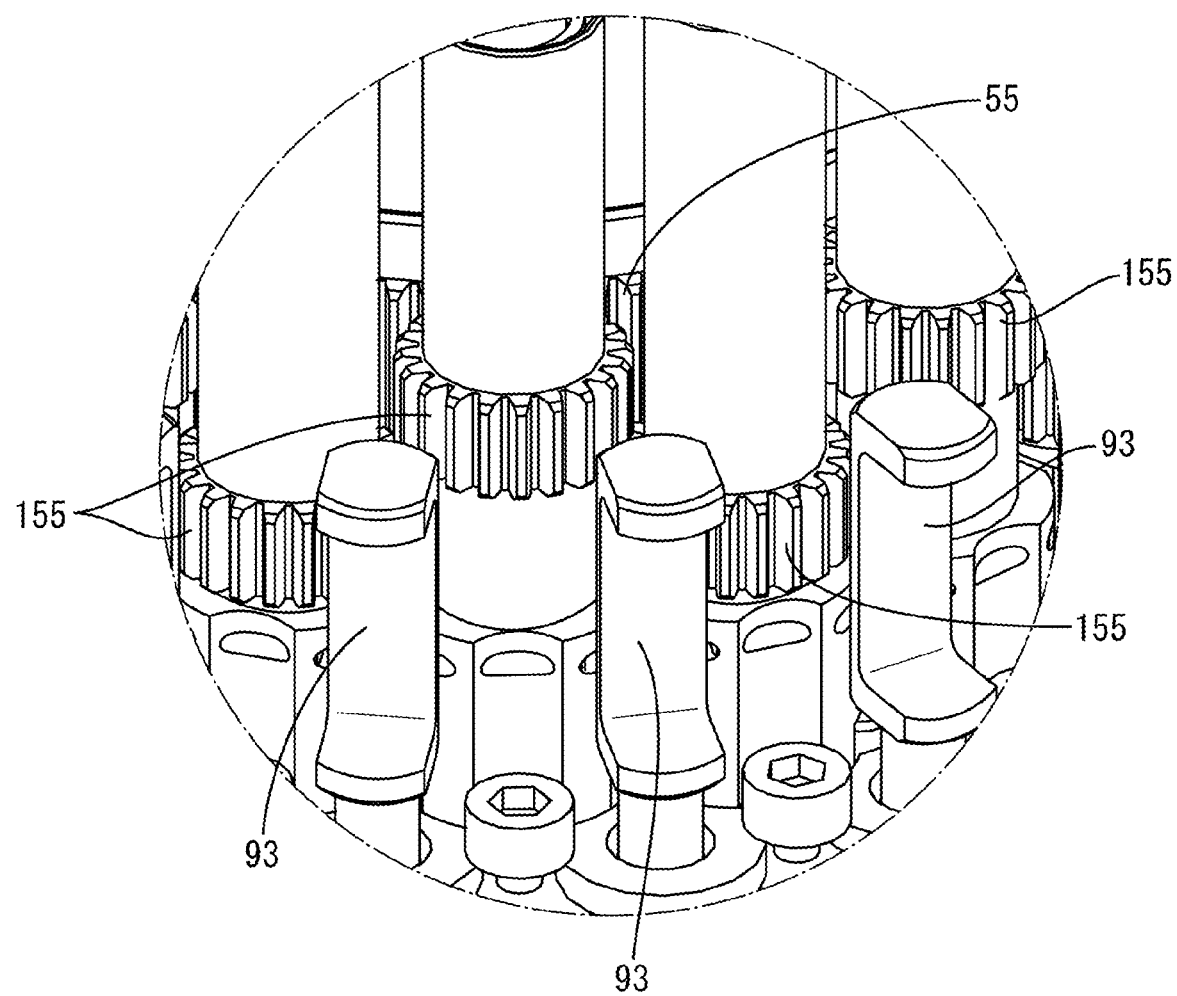
FIG. 5 is a magnified view of a portion A in FIG. 4.

The R-axis drive unit 70 includes an R-axis servomotor 35R (see FIG. 2), an R-axis driving gear 72R (see FIG. 3) disposed on the output shaft of the R-axis servomotor 35R and engaged with the R-axis driven gear 62R, and a common gear 55. The common gear 55 is disposed on the lower portion of the outer shaft 62B. As illustrated in FIG. 5, the common gear 55 is engaged with the gears 155 of the spline nuts 151. When the R-axis servomotor 35R is energized, a driving force of the motor 35R is transmitted to the outer shaft 62B and the common gear 55 through the R-axis driving gear 72R and the R-axis driven gear 62R, rotating the outer shaft 62B and the common gear 55.

The rotation of the common gear 55 rotates the spline nuts 151 due to the engagement of the common gear 55 with the gears 155. Then, since the spline nuts 151 are connected to the corresponding spline shafts 121 through a ball spline mechanism, the eighteen spline shafts 121 are rotated about the respective axes in the same direction by the same angle at the same time due to the rotation of the common gear 55.

The Z-axis drive units (corresponding to an "axial drive unit" of the disclosure) 80 are each configured to move up and down one of the eighteen spline shafts 121 that is located at a predetermined position in the Z direction. The Z-axis drive units 80 are disposed symmetrically on the left and right sides of the head body 60 with the shaft 62 therebetween at positions above the spline shafts 121 (see FIG. 6).

As illustrated in FIG. 2, FIG. 4, and FIG. 6, the Z-axis drive unit 80 includes a box-like body 82 and a Z-axis movable portion 84 configured to move in the Z direction (the up-down direction). A Z-axis linear motor (not illustrated) for driving the Z-axis movable portion 84 by a linear force is disposed in the body 82.

As illustrated in FIG. 4 and FIG. 6, a Z-axis cam follower 86 is rotatably attached to the lower portion of the Z-axis movable portion 84. When the Z-axis movable portion 84 is moved down from a default position illustrated in FIG. 6, the Z-axis cam follower 86 comes in contact with the upper end of the spline shaft 121 that is located at a predetermined position to move the spline shaft 121 downward against an elastic force of the coil spring 230.

This moves the pickup nozzle 250 downward, allowing the end portion of the pickup nozzle 250 to come close to the printed circuit board B1 located at a component feeding position of the feeder 42 or the operation position. When the Z-axis movable portion 84 in this state is moved up, the spline shaft 121 and the pickup nozzle 250 are moved up by an elastic restoring force of the coil spring 230.

The Z-axis cam follower 86 at the default position illustrated in FIG. 6 is located away from the upper end of the spline shaft 121. Thus, when the Z-axis movable portions 84 are located at the default positions illustrated in FIG. 6, the entire rotary body including eighteen spline shafts 121 is able to rotate about the shaft 62 without coming in contact with the Z-axis cam follower 86.

(Switching Device and V-Axis Drive Unit)

As illustrated in FIG. 4 and FIG. 6, the mounting head 50 further includes switching devices 90 configured to switch the pressure applied to the pickup nozzles 250 between a negative pressure and a positive pressure and V-axis drive units 100 configured to activate the switching devices 90. The rotary body 64 has eighteen mounting holes adjacent to the respective through holes 65 for the shaft devices with an equal distance therebetween in the circumferential direction. The switching devices 90 are attached to the respective mounting holes. The number of switching devices 90 mounted in the rotary body 64 is eighteen, which is equal to the number of spline shafts 121.

Figure 16:
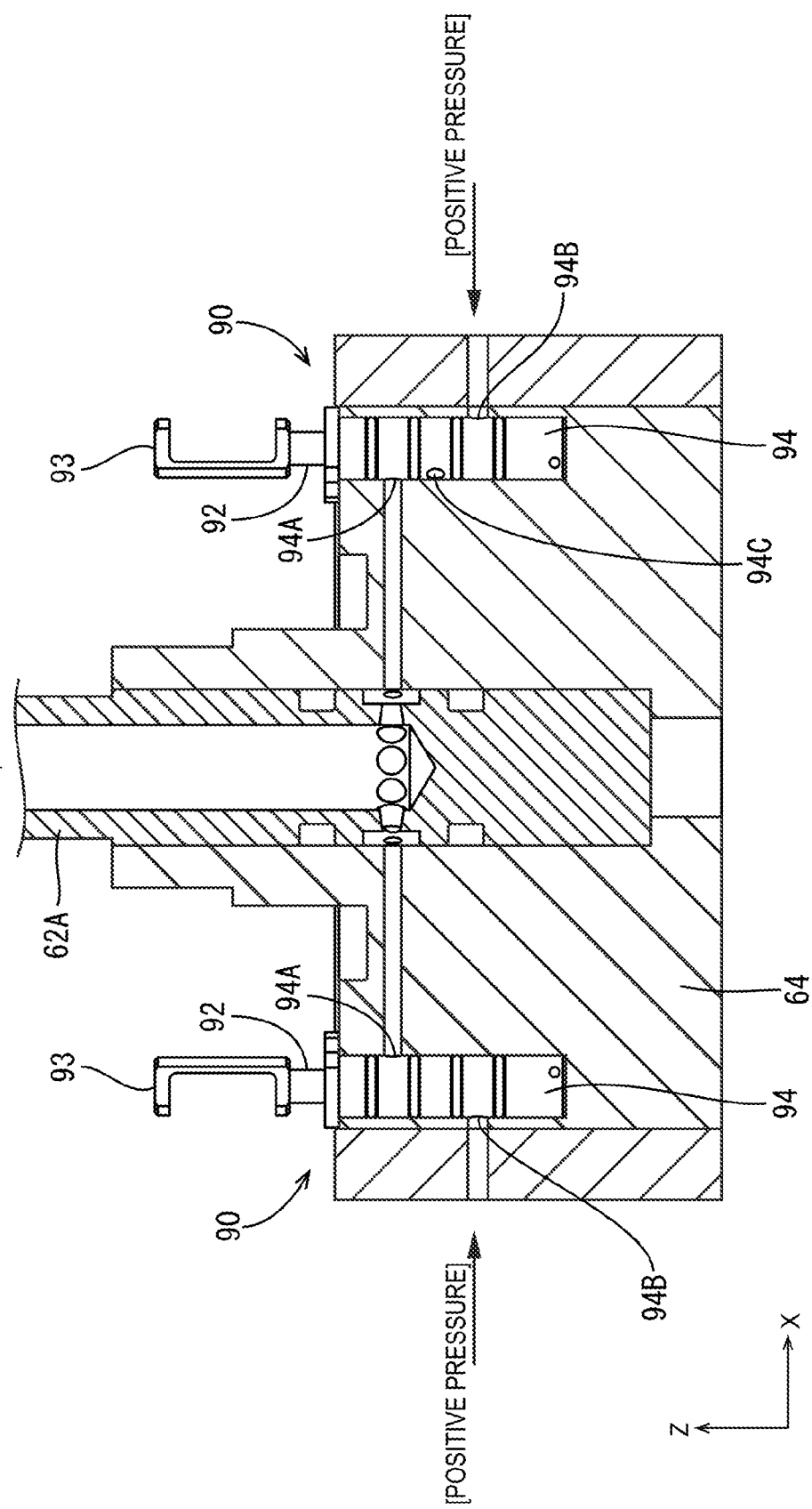
FIG. 16 is a cross-sectional view illustrating a portion of an end portion (a lower end portion) of the mounting head. In the cross-sectional view, a valve spool is located at a positive pressure application position.

As illustrated in FIG. 16, the switching devices 90 each include a valve spool 92 and a cylindrical sleeve 94. As illustrated in FIG. 16, the sleeves 94 each have a negative pressure inlet port 94A, a positive pressure inlet port 94B, and an output port 94C. The output port 94C is in communication with the supply passage 125 located at the middle of the spline shaft 121.

As illustrated in FIG. 16, the valve spool 92 has a contact portion 93 having a laterally facing U-like shape at the upper portion. The valve spool 92 is configured to switch flow paths in the sleeve 94 to change the port that is in communication with the output port 94C. In this embodiment, when the valve spool 92 is located at the upward movement end (hereinafter, referred to as a "negative pressure application position"), the negative pressure inlet port 94A and the output port 94C are in communication with each other in the sleeve 94.

On the other hand, when the valve spool 92 is located at the downward movement end (hereinafter, referred to as a "positive pressure application position"), the positive pressure inlet port 94B and the output port 94C are in communication with each other. Thus, the pressure, which is applied to the pickup nozzle 250 through the supply passage 125 of the spline shaft 121, is switched between a negative pressure and a positive pressure by movement of the valve spool 92.

Next, the V-axis drive unit 100 is described. The V-axis drive unit 100 is configured to move the valve spool 92 in the Z direction (the up-down direction) between the negative pressure application position and the positive pressure application position. The V-axis drive units 100 are symmetrically arranged at the left and right sides of the mounting head 50 with the shaft 62 of the rotary body 60 therebetween in the same manner as the two Z-axis drive units 80. The two V-axis drive units 100 are disposed at positions corresponding to the two Z-axis drive units 80 in the Z direction (see FIG. 6) and configured to move the valve spools 92 of the switching devices 90, which correspond to the pickup nozzles 250 located at the predetermined positions.

As illustrated in FIG. 3, FIG. 4, and FIG. 6, the V-axis drive units 100 each include a box-like body 102 and a V-axis movable portion 104 configured to move in the Z direction (the up-down direction). A V-axis linear motor (not illustrated) is disposed in the body 102.

As illustrated in FIG. 4 and FIG. 6, a cam follower 106 (hereinafter, referred to as a "V-axis cam follower 106") is rotatably attached to the V-axis movable portion 104 through a cam follower supporting portion 105. When the V-axis cam follower 106 at the middle position is moved up by activation of the V-axis drive unit 100, the V-axis cam follower 106 pushes up the contact portion to move the valve spool 92 to the negative pressure application position. Contrary to this, when the V-axis cam follower 106 at the middle position is moved down, the V-axis cam follower 106 pushes down the contact portion to move the valve spool 92 to the positive pressure application position.

Advantages of Embodiment

In the shaft device 120 of the embodiment, since the bearing 200 is a thrust bearing, the bearing 200 is able to have a smaller outer diameter than a radial bearing. This enables the overall size of the shaft device 120 including the bearing 200 to be reduced in the radial direction. Furthermore, the downsize of the shaft device 120 in the radial direction enables the arrangement pitch of the shaft devices 120 to be smaller, enabling more shaft devices 120 to be mounted on the rotary body 64 of the mounting head 50.

Furthermore, in the shaft device 120 of the embodiment, since the bearing 200 is disposed in the housing portion 164, the spline nut 151 is supported in the housing portion 164. Thus, a bearing structure is rigid.

In the shaft device 120 of the embodiment, the housing-side track plate 165 is a bottom wall of the housing 164 and is integrally included in the first shaft tube 161. Thus, the number of components is small compared with a case in which the housing-side track plate 165 and the first shaft tube 161 are separate components.

Furthermore, in the shaft device 120 of the embodiment, the coil spring 230 is configured to function as a return spring that returns the spline shaft 121 automatically to the upward movement end and is also configured to apply a load to the bearing 200 in the axial direction (the Z direction). Thus, the number of components is small compared with a case in which a return spring configured to return the spline shaft 121 automatically to the upward movement end and a spring configured to apply a load to the bearing 200 in the axial direction (the Z direction) are separate components.

Other Embodiments

The technology disclosed herein is not limited to the embodiment described above and illustrated by the drawings. For example, the following embodiments will be included in the technical scope.

Figure 17:
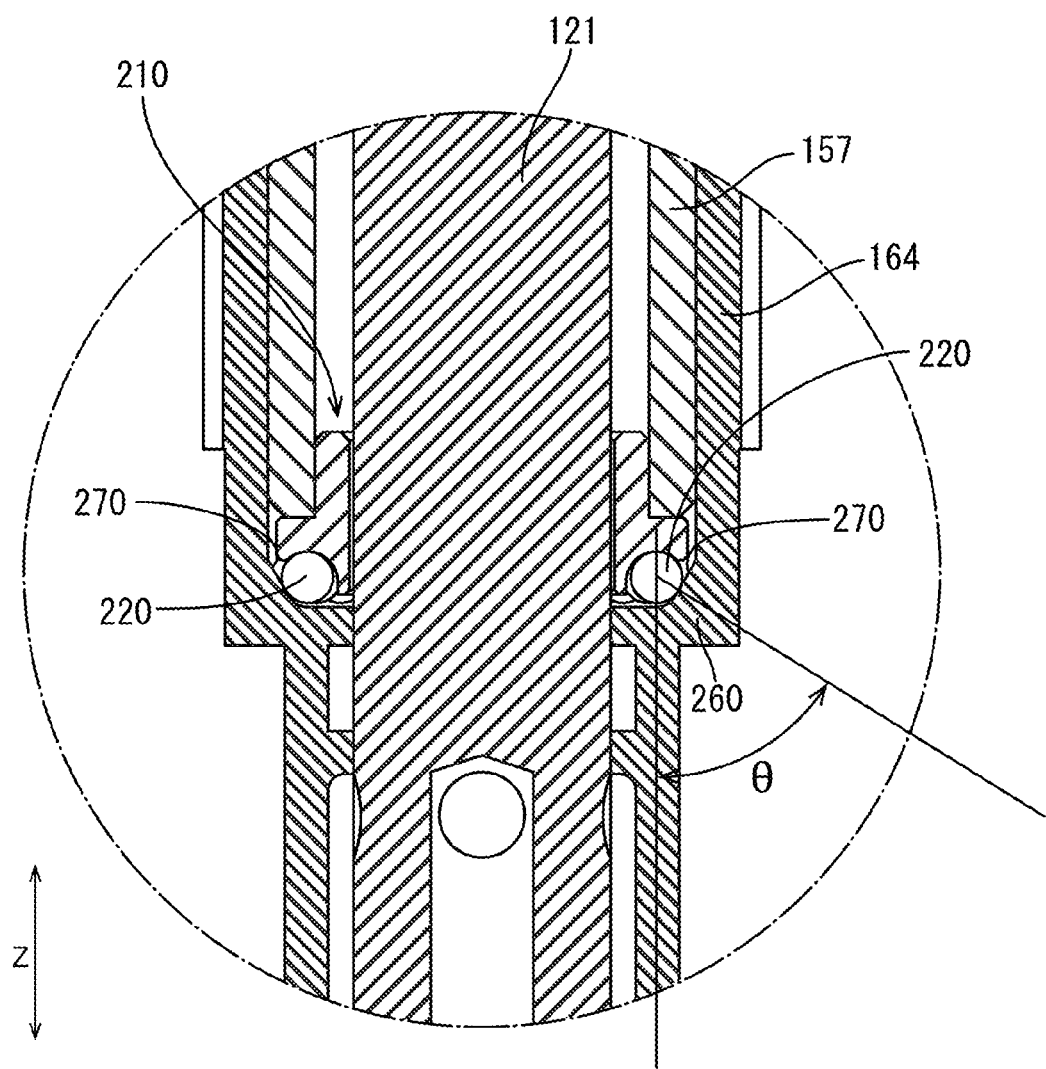
FIG. 17 is a cross-sectional view illustrating another aspect of a bearing.

(1) In the example of the above-described embodiment, the housing-side track plate 165 is integrally included in the first shaft tube 161, but the housing-side track plate 165 and the first shaft tube 161 may be separate components. Furthermore, in the above-described embodiment, the housing-side track plate 165 has the horizontal track surface (the upper surface), but the housing-side track plate 260 may have a tilted track surface 270 as illustrated in FIG. 17. More specifically described, the track surface may be an angular type track surface in which a straight line connecting the center of the ball 220 with a contact point between the ball 220 and the track surface 270 is tilted with respect to the axial direction by a predetermined angle (a contact angle θ).

(2) In the example of the above-described embodiment, the spline shaft 121 and the spline nut 151 are connected to each other through a ball spline mechanism, but may be connected to each other through a spline mechanism using a key and a keyway.

(3) In the example of the above-described embodiment, one coil spring 230 is configured to function as a return spring, which returns the spline shaft 121 automatically to the upward movement end, and configured to apply a load to the bearing 200 in the axial direction. A biasing member for applying a load to the bearing 200 in the axial direction may be a separate component from the return spring of the shaft 121.

(4) In the above-described embodiment, a rotary type mounting head including the shaft devices 120 arranged in the circumferential direction is described as one example of the mounting head. However, the mounting head may be an in-line type mounting head having the nozzle shafts 120 arranged in a straight line extending in one direction, for example. Furthermore, the mounting head may include only one shaft device 120, not a plurality of shaft devices 120.

(5) In the above-described embodiment, the pickup nozzle 250 is described as one example of a component retainer, but the component retainer may be a chuck type component retainer.

What is claimed is:

1. A shaft device comprising:
   a nut support, a spline shaft, a shaft hole, a spline nut, a thrust bearing, and a return spring;
   the spline nut having a tubular shape, being disposed coaxially with a portion of the spline shaft protruding upward from the shaft hole;
   the thrust bearing rotatably supporting the spline nut in a housing portion, wherein the thrust bearing further comprising:
     a shaft-side track plate being in contact with an end of the spline nut;
     a housing-side track plate being composed of a bottom wall of the housing portion; and
     a rolling element locating between the shaft-side track plate and the housing-side track plate
   the return spring being configured to bias the thrust bearing in an axial direction of the spline shaft, wherein
   the nut support including the housing portion housing an end portion of the spline nut.

2. A mounting head comprising:
   the shaft device according to claim 1;
   a component retainer disposing at an end of the spline shaft and configuring to hold an electronic component;
   a base supporting the shaft device;
   an axial drive unit being configured to move the spline shaft in the axial direction; and
   a rotary drive unit being configured to transmit torque to the spline nut to rotate the spline shaft about its axis.

3. The mounting head according to claim 2, wherein
   the return spring locating between the spline shaft and the spline nut in a compressed state, being configured to return the spline shaft moved downward by the axial drive unit to an upward movement end, and
   the return spring being configured to bias the thrust bearing in the axial direction via the spline nut.

4. A surface mounter comprising:
   the mounting head according to claim 3, wherein
   the surface mounter is configured to mount the electronic component held by the component retainer of the mounting head onto a board.

* * * * *